(12) United States Patent
Mayer

(10) Patent No.: US 10,260,909 B2
(45) Date of Patent: Apr. 16, 2019

(54) POSITION MEASURING DEVICE

(71) Applicant: DR. JOHANNES HEIDENHAIN GmbH, Traunreut (DE)

(72) Inventor: Elmar Mayer, Nußdorf (DE)

(73) Assignee: DR. JOHANNES HEIDENHAIN GMBH, Traunreut (DE)

(*) Notice: Subject to any disclaimer, the term of this patent is extended or adjusted under 35 U.S.C. 154(b) by 35 days.

(21) Appl. No.: 15/212,943

(22) Filed: Jul. 18, 2016

(65) Prior Publication Data

US 2017/0030743 A1 Feb. 2, 2017

(30) Foreign Application Priority Data

Jul. 30, 2015 (EP) .................................... 15179014

(51) Int. Cl.
*G01D 5/26* (2006.01)
*G01D 5/347* (2006.01)
*H02S 40/44* (2014.01)
*H01L 31/0203* (2014.01)

(52) U.S. Cl.
CPC ........... *G01D 5/26* (2013.01); *G01D 5/34715* (2013.01); *H02S 40/44* (2014.12); *H01L 31/0203* (2013.01); *H01L 2224/73204* (2013.01); *H01L 2224/73253* (2013.01)

(58) Field of Classification Search
CPC ................................................... H01L 2924/00
See application file for complete search history.

(56) References Cited

U.S. PATENT DOCUMENTS

| 6,519,044 | B1 | 2/2003 | Holzapfel et al. |
| RE40,676 | E | 3/2009 | Holzapfel et al. |
| 8,212,202 | B2 | 7/2012 | Wong et al. |
| 2002/0031862 | A1* | 3/2002 | Ohsawa ............ H01L 23/49861 438/112 |

(Continued)

FOREIGN PATENT DOCUMENTS

| DE | 198 55 307 | 8/1999 |
| DE | 10 2010 000 731 | 7/2010 |

(Continued)

*Primary Examiner* — Thanh Luu
(74) *Attorney, Agent, or Firm* — Hunton Andrews Kurth LLP

(57) ABSTRACT

A position measuring device includes a measuring standard and a scanning unit, which are arranged in a manner that allows them to move relative to each other in a measuring direction. The measuring standard includes a graduation, which is scannable by the scanning unit in order to generate positional signals. The scanning unit includes an illumination unit and a detector unit for generating positional signals, the illumination unit being able to emit light in the direction of the graduation and the detector unit being able to detect light modulated by the graduation. The detector unit includes a circuit board and a sensor unit, which is arranged as a semiconductor chip. At least two photodetectors are provided on a front side of the sensor unit facing the graduation, and the electrical connections of the sensor unit are routed to contact surfaces on its rear side by metallic vias. The sensor unit is connected via the contact surfaces to corresponding contact surfaces on the circuit board.

15 Claims, 4 Drawing Sheets

(56) References Cited

U.S. PATENT DOCUMENTS

| | | | |
|---|---|---|---|
| 2012/0281989 A1* | 11/2012 | Dong | H04B 10/693 398/202 |
| 2012/0301149 A1* | 11/2012 | Pinguet | H01L 21/84 398/115 |
| 2014/0034819 A1 | 2/2014 | Mutschler et al. | |
| 2014/0070421 A1* | 3/2014 | Tremlett | H01L 23/525 257/773 |

FOREIGN PATENT DOCUMENTS

| | | | |
|---|---|---|---|
| EP | 2 693 166 | 2/2014 | |
| JP | WO 2014128796 A1 * | 8/2014 | H01L 21/561 |

* cited by examiner

POSITION MEASURING DEVICE

CROSS-REFERENCE TO RELATED APPLICATION

The present application claims priority to Application No. 15179014.4, filed in the European Patent Office on Jul. 30, 2015, which is expressly incorporated herein in its entirety by reference thereto.

FIELD OF THE INVENTION

The present invention relates to a position measuring device, for example, of the type used in automation systems for the purpose of measuring positions and/or angles.

BACKGROUND INFORMATION

Position measuring devices are widely used in tool machines and automation systems, in particular. They are employed for determining the relative position of two objects that can move relative to each other. A basic distinction is made between linear and angle measuring devices. Linear measuring devices, for example, are used to determine the relative position of two machine components of a tool machine that are able to move with respect to each other. A measuring standard, e.g., in the form of a straight scale on which a graduation is provided, is connected to one of the two objects for this purpose, and a scanning unit is connected to the other, so that position-dependent scanning signals, which can be used to determine the degree of movement of the two objects with respect to each other along the movement direction, can be obtained by scanning the graduation.

Angle-measuring devices, also referred to as rotary encoders, are designed according to the same principle. Instead of the scale, however, a circular disk is used as a measuring standard in such a case, on which the graduation is applied concentrically with the pivot point. The disk is connected in rotationally fixed manner to a shaft to be measured, while the scanning unit is fixedly mounted with respect thereto.

The graduation may include one or more graduation track(s), a distinction being made between incremental and absolute encoded graduation tracks. Incremental graduation tracks are made up of evenly spaced graduation elements, which, given a uniform relative movement between measuring standard and scanning unit, provide substantially sinusoidal scanning signals when scanned. In this case, the travel is ascertained by counting the signal periods or fractions of signal periods. An absolute travel determination requires the specification of a reference point, for which a reference mark is provided, for example, which is likewise detected by the scanning unit. The scanning signals from absolute encoded graduation tracks, on the other hand, are able to be used for a direct detection of the absolute position, inasmuch as they are encoded in multiple adjacently located graduation tracks (e.g., Gray code, BCD code, etc.) or are serially encoded in one graduation track (e.g., chain code, PRC). In addition, there are also graduations that include both incremental and absolute graduation tracks.

One widely used operating principle in the case of position measuring devices is optical scanning. In this case, directed light that is emitted by a light source is used for imaging the graduation mounted on a measuring standard on a number of photodetectors. The measuring standard is disposed in the optical path of the light in a manner that allows it to move, and modulates the light when the graduation is moved in relation to the light source and the photodetectors. The position, or the change in position, is ascertained by analyzing the output signals of the photodetectors. The graduation may consist of regions having different optical characteristics such as transparent/opaque.

The photodetectors required for the scanning are usually situated together on a semiconductor chip, which is mounted directly on a circuit board using chip-on-board technology (COB). In the process, the rear side of the chip is first glued to the circuit board and the contact surfaces on its topside are then connected to the circuit board using wire bonding. In addition to the photodetectors, at least parts of the evaluation electronics for the scanning signals are frequently situated on the semiconductor chip as well.

FIG. 3 schematically illustrates the components that are relevant in connection with the position measurement of a conventional position measuring device, i.e., a scanning unit 10 and a measuring standard 40, which includes a graduation 41.

Scanning unit 10 and measuring standard 40 are situated in a manner that allows them to move relative to each other in a measuring direction X. For example, if the position measuring device is a device for a linear measurement (linear position measuring device), then measuring standard 40 is provided in the form of a straight scale, which is mounted on a first machine component and on which a graduation 41 is present in measuring direction X. Scanning unit 10 is fastened to a second machine component, such that when the first machine component executes a movement in measuring direction X in relation to the second machine component, scanning unit 10 is moved along the scale and scans graduation 41 in the process. The scanning results in scanning signals, from which position values are generated in the course of further processing.

In the case of rotary position measuring devices (rotary transducers or angle-measuring devices), measuring standard 40, for example, is a circular disk, which is connected to a shaft whose angular position is to be measured in a rotatably fixed manner. Graduation 41 is disposed concentrically with the rotational axis of the shaft. The scanning unit, on the other hand, is firmly mounted such that the graduation can be scanned when the shaft to be measured executes a rotation, and position values, in this case, angle values, are in turn able to be generated from the scanning signals.

Scanning unit 10 includes an illumination unit 20 and a detector unit 530. The operating principle on which the position measuring device is based is optical transmitted-light scanning. This means that graduation 41 on measuring standard 40 is positioned between illumination unit 20 and detector unit 530. Illumination unit 20 emits light in the direction of graduation 41. Graduation 41 includes light-transmitting (transparent) and opaque regions, which modulate the light of illumination unit 20. The modulated light is imaged on detector unit 530, which then generates positional signals from it.

Optical transmitted-light scanning uses light that is collimated. To generate collimated light, illumination unit 20, for instance, may include a light source 21 which radiates divergent light that is collimated by a collimator 22.

Measuring standard 40 may be made from a transparent material, such as glass. In this case, graduation 41 is formed by opaque regions, for instance, made of metal that is applied on the measuring standard. Chromium, for example, is especially suitable for this purpose. However, there are also measuring standards 40 which are made from an opaque material, such as metal. Graduation 41 may include a sequence of metal webs and openings in measuring standard 40.

Detector unit 530 includes a circuit board 531, a sensor unit 532, and, in particular when small graduation periods of graduation 41 are to be scanned, a scanning plate 533.

Circuit board 531 functions, for example, as a carrier for sensor unit 532, which constitutes the central component of detector unit 530. In addition to supplementary electronic circuits for sensor unit 532, input/output interfaces in the form of plug-and-socket connectors, for instance, are provided on circuit board 531.

Sensor unit 532 is arranged as a semiconductor chip. It has a front side and a rear side, the side facing circuit board 531 forming the rear side, and the side facing graduation 41 forming the front side of sensor unit 532. Situated on the front side of sensor unit 532 are a number of photodetectors 535, which are used for generating positional signals by detecting the light of illumination unit 20, which is modulated by graduation 41 and possibly scanning plate 533. The front side of sensor unit 532 is preferably aligned in parallel with the plane in which graduation 41 is situated. In addition to photodetectors 535, sensor unit 532 includes additional components for processing the positional signals, possibly even including the generation of position values from the positional signals. Moreover, the sensor unit may include a multitude of additional circuit blocks, such as fault correction, circuits for ensuring functional safety, and a digital interface for communicating with sequential electronics. A semiconductor chip which includes both photodetectors and components for signal processing is referred to as an opto-ASIC.

The rear side of sensor unit 532 is connected to circuit board 531, the connection being created by bonding, for example. For the electrical connection of the circuit components of sensor unit 532 to circuit board 531, the front side of sensor unit 532 and the side of circuit board 531 facing sensor unit 532 are provided with corresponding contact surfaces, which are connected to each other in a conventional manner by wire bonding using bonding wires 537. An encapsulating material 538 protects bonding wires 537 from mechanical effects.

Wire bonding is a complex manufacturing process, both in terms of the purchasing costs of the required manufacturing systems (wire bonding) and the additional time required for the wire bonding process, the encapsulation of the bonding wires and curing of the encapsulation mass.

The result of this packaging is a dam around the photodetectors, which projects by a height c in relation to the front side of sensor unit 532 (i.e., the surface of the semiconductor chip on which the photodetectors are situated). Height c amounts at least to 0.5 mm in conventional production methods. Taking into account manufacturing tolerances attributable in particular to fluctuations in the thickness of the encapsulation mass 538, a scanning distance d of between 0.55 mm and 0.7 mm must be maintained in order to be able to ensure a safe operation, this scanning distance d being defined by the clearance between the front side of sensor unit 32 (the surface of the semiconductor chip on which the photodetectors are situated) and the surface of measuring standard 40 (which is to be equated with the surface of graduation 41 in the example illustrated).

Scanning plate 533 is required in particular when scanning small graduation periods. It is situated between photodetectors 535 on the front side of sensor unit 532 and graduation 41. Similar to measuring standard 40, it has a graduation structure that optimizes the imaging of graduation 41 to photodetectors 535.

German Published Patent Application No. 198 55 307 describes a scanning unit in which the sensor unit is contacted with the aid of wire bonding. A cover element, the thickness of which is even greater than that of the contacting region, is additionally situated above the radiation-sensitive region.

Any dirt that accumulates in the optical path of the light has a detrimental effect on the function in the optical scanning principle. This applies to liquid contaminants, in particular. It occurs in the form of fluid droplets, which consist of lubricants, condensed water, coolant, etc., for example. Not only does this reduce the analyzable light quantity that impinges upon the photodetectors, but it also disperses the light, so that it is distributed to multiple photodetectors situated next to each other.

The dam of encapsulating material 538 has negative effects with regard to dirt deposits, since it promotes the collection of dirt deposits within the dam, depending on the position.

To prevent problems caused by dirt deposits, special attention is paid during the construction process of position measuring devices featuring optical scanning to ensure that the introduction of dirt particles, whether in solid or liquid form, is avoided. For example, this may be accomplished through the material selection or special constructive measures.

However, it is difficult to avoid contamination altogether. Therefore, an attempt is made to compensate for the effect of dirt particles by creating redundancy in the scanning or by complex signal processing of the scanning signals.

Despite all of these measures, dirt particles, especially in liquid form, are a potential source of failure in optical position measuring devices.

SUMMARY

Example embodiments of the present invention provide a position measuring device which is easy to manufacture and features low sensitivity with regard to soiling.

According to an example embodiment of the present invention, a position measuring device includes a measuring standard and a scanning unit, which are situated in a manner that allows them to move relative to each other in a measuring direction. The measuring standard includes a graduation, which can be scanned by the scanning unit in order to generate positional signals. The scanning unit includes an illumination unit and a detector unit, the illumination unit being able to emit light in the direction of the graduation and the detector unit being able to detect light modulated by the graduation, the detector unit including a circuit board and a sensor unit, which is arranged as a semiconductor chip. At least two photodetectors are provided on a front side of the sensor unit facing the graduation, and the electrical connections of the sensor unit are routed to contact surfaces on its rear side via metallic vias. The sensor unit is connected to corresponding contact surfaces on the circuit board via the contact surfaces.

Further features and aspects of example embodiments of the present invention are described in more detail below with reference to the appended Figures.

BRIEF DESCRIPTION OF THE DRAWINGS

FIG. 4b schematically illustrates a variant of the detector unit illustrated in FIG. 4a.

DETAILED DESCRIPTION

Figure 1:
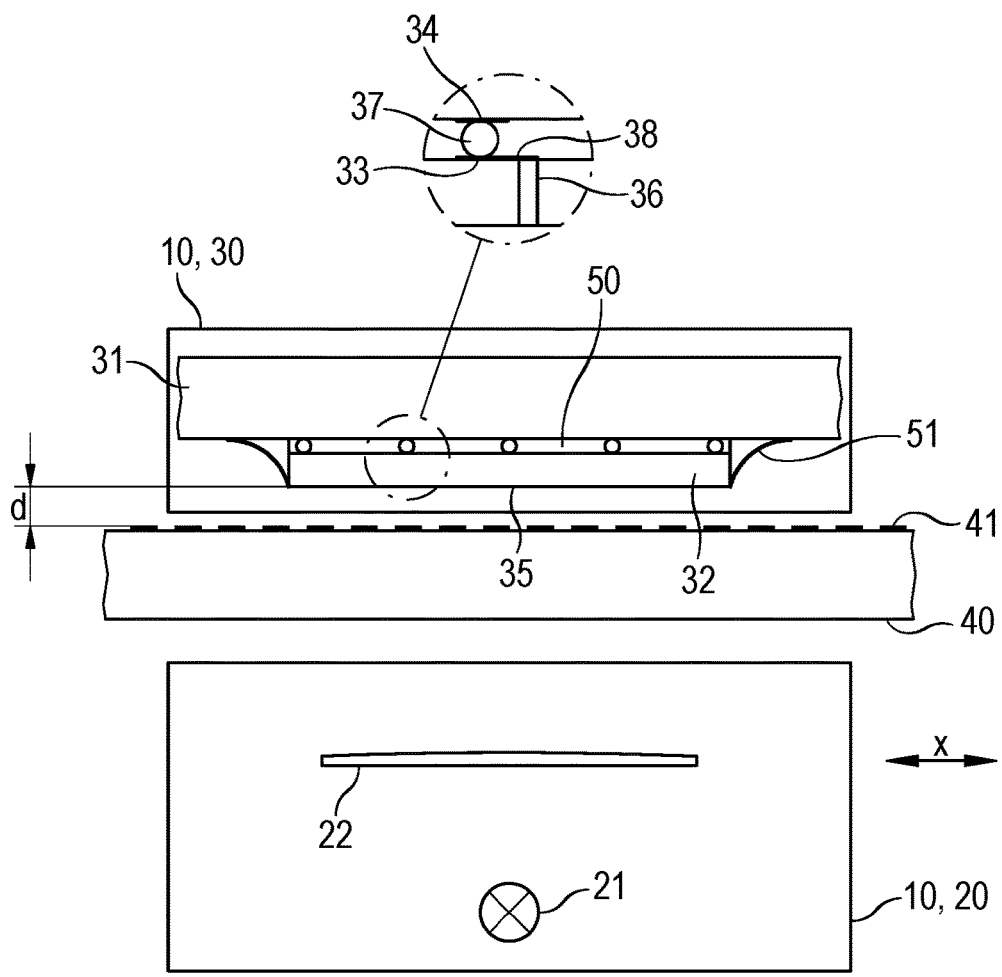
FIG. 1 schematically illustrates a position measuring device according to an example embodiment of the present invention.
Figure 3:
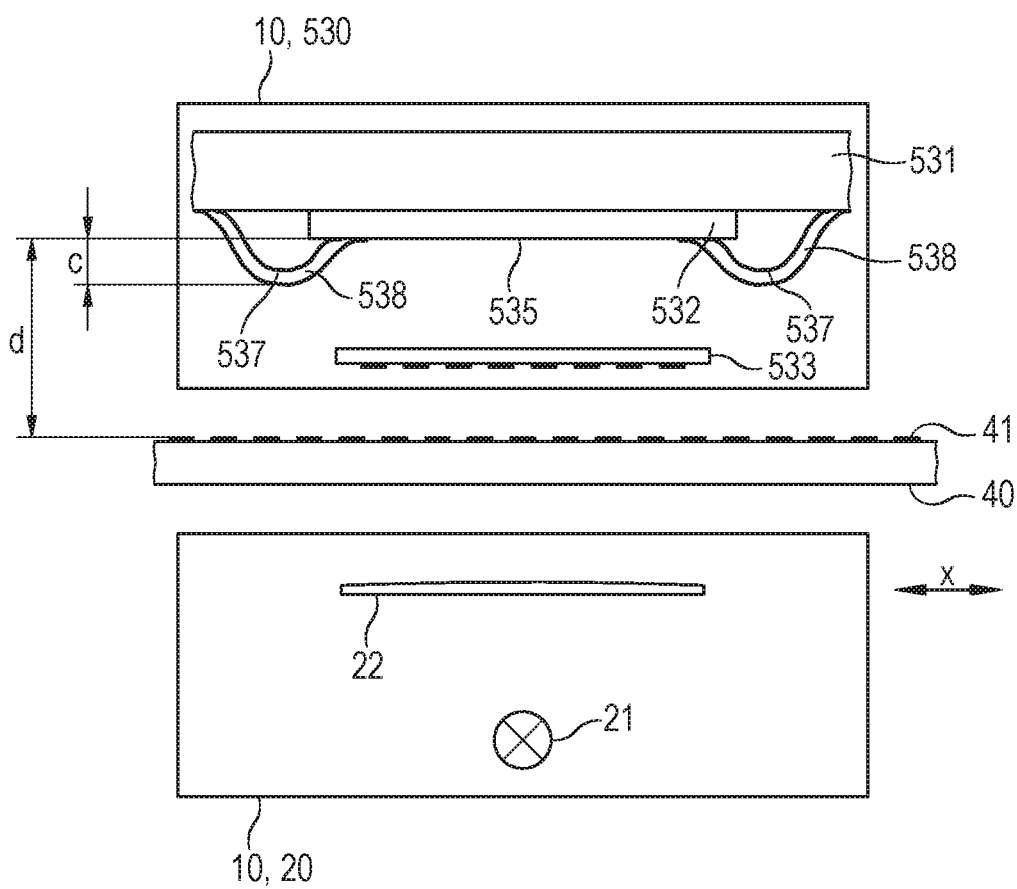
FIG. 3 schematically illustrates a conventional position measuring device.

FIG. 1 schematically illustrates the components of a position measuring device according to an example embodiment of the present invention that are relevant in the context of the position measurement. The basic configuration corresponds to the position measuring device described above with reference to FIG. 3. Components that were already described in connection with FIG. 3 bear the same reference numerals in FIG. 1.

The position measuring device includes a scanning unit 10 and a measuring standard 40 on which a graduation 41 is provided. Scanning unit 10 includes an illumination unit 20, which may be conventional, and a detector unit 30.

In detector unit 30, a sensor unit 32, which is arranged as a semiconductor chip, is electrically connected to circuit board 31 not by wire bonding, but rather by routing the connections of the electric circuit in the semiconductor chip via through-connections, or vias, 36 through the semiconductor substrate from which the semiconductor chip is made, to contact surfaces 33 on the rear side of the chip, and by establishing the electrical connection to corresponding contact surfaces 34 of circuit board 31 via a soldering method. It is possible, for example, to first apply small metal balls 37 to contact surfaces 33 of the semiconductor chip, which are then connected to corresponding contact surfaces 34 on circuit board 31 by reflow soldering. The labor-intensive wire bonding process is therefore replaced by a standard soldering process. This makes it possible to place sensor unit 32 on circuit board 31 together with the other components at the time when the circuit board 31 is fitted with components, whereupon the soldering is performed.

The front side of a sensor unit 32 arranged in this manner has a planar top surface, which makes it more difficult for dirt particles to adhere than in the case of a conventional sensor unit 532.

Provided on the front side of sensor unit 32 are at least two photodetectors 35, which detect the light of illumination unit 20 modulated by graduation 41. The actual number of photodetectors 35 depends on the configuration of graduation 41. If graduation 41 has more than one graduation track (for instance an incremental one and one or more absolute encoded graduation track(s) in parallel therewith), then a suitable number of photodetectors 35 is situated at the positions assigned to the graduation tracks transversely to measuring direction X. The positional signals obtained in this manner are processed by a signal processing circuit, which, for example, is partially or also completely integrated in sensor unit 32, and are forwarded to sequential electronics. As mentioned above, a semiconductor chip that includes both photodetectors and a signal processing electronics system is an opto-ASIC.

Circuit board 31 may be made from fiber glass-reinforced epoxy resin (epoxy), but it is also possible to use ceramic materials such as aluminum oxide, for example.

Vias 36 are placed vertically and made from metal, so that they have similar electrical characteristics as the bonding wires. Contact surfaces 33 on the semiconductor chip of sensor unit 32 need not necessarily be situated directly above vias 36. Instead, they may be placed at an offset from each other and be interconnected via a circuit track 38 (redistribution layer).

If the semiconductor chip is based on a silicon substrate, as is currently often the case, silicon vias or through-silicon vias (TSV) may be provided. Semiconductor chips provided with silicon vias are currently used predominantly in image sensors for digital photography because the usable light-sensitive surface of the image points (pixels) can be enlarged since the contact surfaces are shifted to the rear side of the chip. In addition, semiconductor chips having silicon vias are employed to produce 3D-integrated circuits (3D-IC), since this packaging technology is suitable for stacking and connecting multiple chips on top of one another.

Shifting contact surfaces 33 from the front side of sensor unit 32 to the rear side of sensor unit 32 makes it possible to considerably reduce scanning distance d in comparison with conventional systems, scanning distance d being defined as the distance between the front side of sensor unit 32 (i.e., the surface of the semiconductor chip on which the photodetectors are situated) and the surface of graduation 41 (which in the example illustrated is to be equated with the surface of measuring standard 40 due to the limited thickness of the graduation markings). Because bonding wires 537 and encapsulation mass 538 are omitted (that is to say, by completely eliminating the dam having height c), scanning distance c depends solely on structure tolerances (e.g., the parallelism of the surface of sensor unit 32 in relation to the surface of measuring standard 40) and the mechanical guidance of scanning unit 10 or sensor unit 32 in relation to measuring standard 40. Values of less than 0.55 mm can be selected for scanning distance d in all cases, and given a mechanical design of sufficient precision, it is even possible to achieve values of less than 0.1 mm and down to 0.03 mm for scanning distance d.

Further electronic components that are required in addition to sensor unit 32, as well as plug-and-socket connectors, etc., may be provided on the rear side of circuit board 31 or in areas in which circuit board 31 and measuring standard 40 do not overlap in the assembled state.

Another advantage that results when using a sensor unit 32 described herein is that no scanning plate will be necessary at a small scanning distance d. This reduces the number of surfaces in the optical path of the light to be detected whose optical characteristics can be adversely affected by contamination.

Figure 2A:
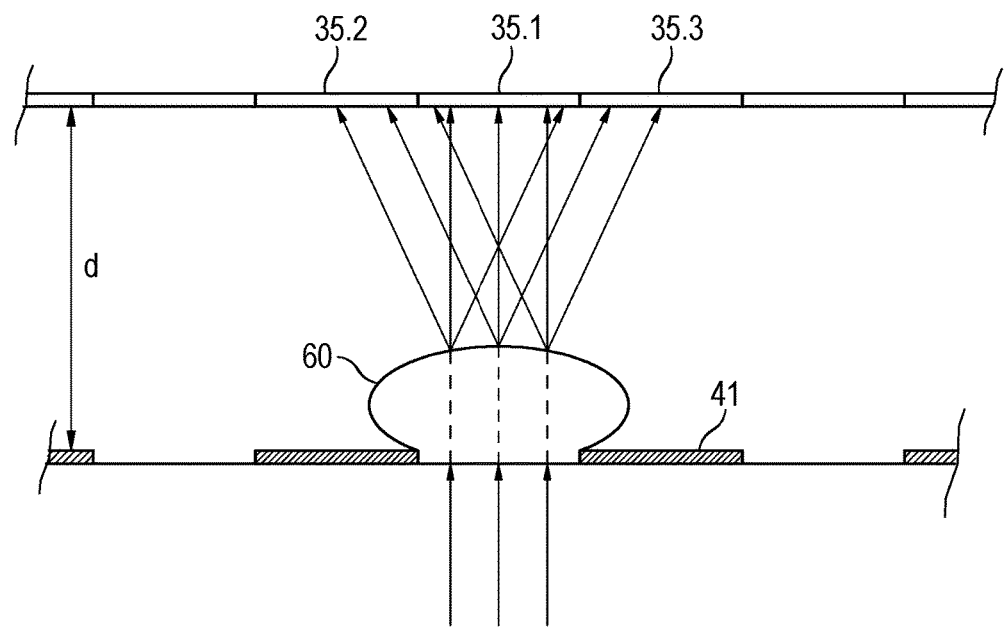
FIG. 2a schematically illustrates the dispersion of the light caused by a fluid droplet at a large scanning distance.
Figure 2B:
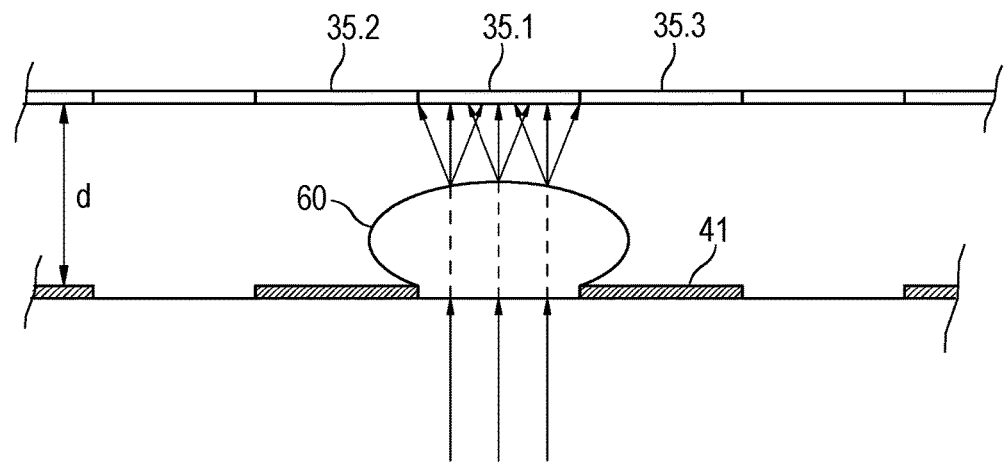
FIG. 2b schematically illustrates the dispersion of the light caused by a fluid droplet at a short scanning distance.

FIGS. 2a and 2b illustrate the influence of scanning distance d on the contamination sensitivity of optical scanning in the presence of contamination in the form of fluid droplets. Here, it is assumed that a fluid droplet 60 is situated on graduation 41. Fluid droplets have a dispersing effect on light beams. This causes a diffuseness in the imaging of graduation 41 on photodetectors 35 (a central photodetector 35.1 and two adjacent photodetectors 35.2, 35.3 are illustrated in each case), the diffuseness becoming more pronounced as scanning distance d grows larger.

As illustrated in FIG. 2a, a large scanning distance d causes a considerable portion of the dispersed light to impinge upon adjacent photodetectors 35.2, 35.3. This reduces a positional signal detected by central photodetector 35.1, while adjacent photodetectors 35.2, 35.3 detect faulty positional signals. On the whole, the reliability of the position measurement is affected in an adverse manner.

Reducing scanning distance d, as illustrated in FIG. 2b, has the result that a large portion of the light to be detected impinges upon central photodetector 35.1 despite the dispersion of the light, and that only a negligible portion of the dispersed light reaches adjacent photodetectors 35.2, 35.3. This increases the reliability of the position measurement significantly.

Moreover, a small scanning distance d causes larger fluid droplets to be compressed between the front side of sensor unit 32 and the surface of measuring standard 40 and to thereby form a uniform fluid film, which considerably reduces a dispersion of the light. This effect is noticeable when scanning distance d is reduced to less than 0.3 mm.

As illustrated in FIG. 1, the cavity underneath sensor unit 32 that remains after the solder process is able to be filled with an elastic, temperature-stable plastic material (underfiller 50) in an underfill process. Apart from increasing the mechanical stability of the structure and compensating for different coefficients of thermal expansion of the employed materials, this also effectively prevents contamination, in particular fluid droplets 60, from reaching the region of the solder connections between sensor unit 32 and circuit board 31. Electrical malfunctions, caused by leakage currents due to an ohmic connection of contacts with conductive fluids, and damage to the solder points by corrosion are able to be prevented in this manner.

It is furthermore advantageous to provide a side guard 51 of a plastic material around sensor unit 32, which protects the lateral surfaces of sensor unit 32 from mechanical damage, for example, caused by larger dirt particles. Side guard 51 may end flush with the edge of sensor unit 32 that is associated with the front side.

The same material may be used for side guard 51 and underfiller 50.

Figure 4A:
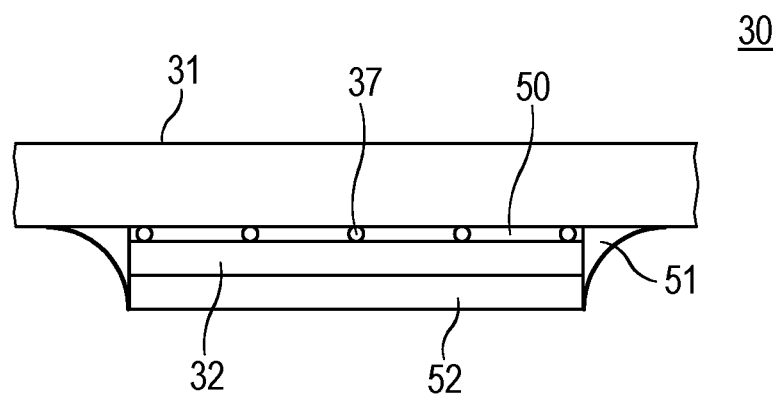
FIG. 4a schematically illustrates a modification of the detector unit illustrated in FIG. 1.

FIG. 4a shows a modification of detector unit 30 in relation to FIG. 1, in which the front side of sensor unit 32 is protected from damage by a protective window 52 made of a suitable transparent material (glass, etc.). The connection between sensor unit 32 and protective window 52 may be created by surface bonding or by optical contact bonding.

This configuration is particularly easy to produce if in the production of a wafer having a multitude of sensor units 32, the wafer is already connected to a disk of the material of protective window 52 before individual sensor units 32 are sawed out. By being sawed out jointly, sensor unit 32 and protective window 52 have the same surface area. In this particular case, side guard 51 may be extended to a height such that it projects beyond the side surfaces of sensor unit 32 and at least partially covers the side surfaces of protective window 52. In this manner, sensor unit 32 will be protected from mechanical damage on all sides in the fully assembled state.

Figure 4B:
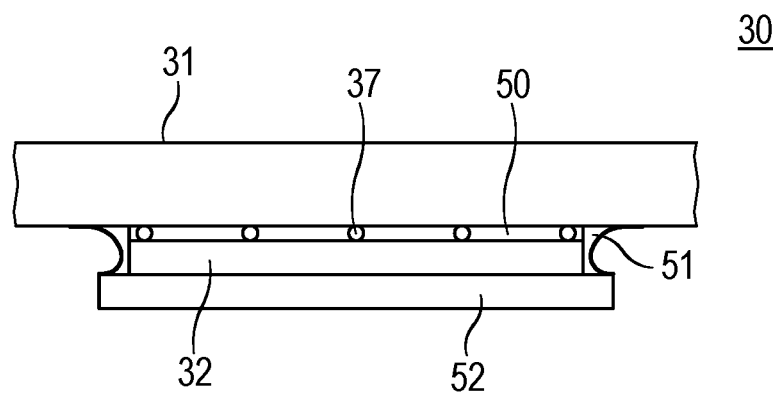

An even more robust configuration of detector unit 30 is obtained if the surface area of protective window 52 is larger than the surface area of sensor unit 32, as illustrated in FIG. 4b. In this case, side guard 51 connects circuit board 31 to the rear side of protective window 52 facing sensor unit 32. This arrangement, as well, is easy to produce if the wafer with sensor units 32 and the disk of the material of protective window 52 are already connected to each other and the regions between sensor units 32 are exposed down to the disk of the material of protective window 52 by etching in an etching step before sensor units 32 are cut out.

Because of protective window 52, the minimally achievable scanning distance d is enlarged. Regardless, the thickness of the protective window may be selected such that it is less than height c specified by the wire bonding (approximately 0.5 mm), so that a smaller scanning distance d is achievable than the value of 0.55 mm specified in conventional systems. The thickness of the protective window may be in a range between 0.2 mm and 0.4 mm, the lower limit being able to be reduced even further by greater effort in the production.

In the event that a scanning plate is required because of greater scanning distance d in conjunction with fine graduation periods of graduation 41, then a graduation structure that fulfills the function of a scanning plate may be mounted on the front side of protective window 52 facing graduation 41, without any increase in the number of surfaces exposed to contamination.

As an alternative, the front side of sensor unit 32 may be protected from mechanical damage by a clear lacquer or a transparent encapsulation compound.

What is claimed is:

1. A position measuring device, comprising:
a measuring standard; and
a scanning unit;
wherein the measuring standard and the scanning unit are movable relative to each other in a measurement direction;
wherein the measuring standard includes a graduation that is scannable by the scanning unit to generate positional signals, the scanning unit including an illumination unit and a detector unit adapted to generate the positional signals, the illumination unit adapted to emit light in a direction of the graduation, the detector unit adapted to detect light modulated by the graduation, the detector unit including a circuit board and a sensor unit arranged as a semiconductor chip;
wherein at least two photodetectors are arranged on a front side of the sensor unit facing the graduation, electrical connections of the sensor unit routed to contact surfaces on a rear side by metallic vias, the sensor unit connected via the contact surfaces to corresponding contact surfaces on the circuit board;
wherein the sensor unit is directly connected to the circuit board via the contact surfaces of the sensor unit being directly solder-connected to the corresponding contact surfaces on the circuit board; and
wherein a scanning distance between the front side of the sensor unit and a surface of the graduation is less than 0.55 mm.

2. The position measuring device according to claim 1, wherein a remaining cavity between the circuit board and the sensor unit is filled with an underfiller.

3. The position measuring device according to claim 1, wherein a side guard is provided around the sensor unit.

4. The position measuring device according to claim 1, the front side of the sensor unit is protected from mechanical damage by a protective window glued across a surface or connected by optical contact bonding.

5. The position measuring device according to claim 4, wherein the protective window includes a surface that is identical in size to the sensor unit or that is larger than the sensor unit.

6. The position measuring device according to claim 4, wherein a graduation structure is provided on a side of the protective window facing the graduation.

7. The position measuring device according to claim 1, wherein the front side of the sensor unit is protected from mechanical damage by a clear lacquer or clear encapsulating compound.

8. The position measuring device according to claim 1, wherein a scanning distance between the front side of the sensor unit and a surface of the graduation is less than 0.3 mm.

9. The position measuring device according to claim 1, wherein the sensor unit includes an opto-ASIC.

10. The position measuring device according to claim 1, wherein the position measuring device is arranged as a linear encoder.

11. The position measuring device according to claim 1, wherein the position measuring device is arranged as a rotary encoder.

12. The position measuring device according to claim 1, wherein the position measuring device includes no scanning plate between the measuring standard and the scanning unit.

13. A position measuring device, comprising:
   a measuring standard; and
   a scanning unit;
   wherein the measuring standard and the scanning unit are movable relative to each other in a measurement direction;
   wherein the measuring standard includes a graduation that is scannable by the scanning unit to generate positional signals, the scanning unit including an illumination unit and a detector unit adapted to generate the positional signals, the illumination unit adapted to emit light in a direction of the graduation, the detector unit adapted to detect light modulated by the graduation, the detector unit including a printed circuit board and a sensor unit, the sensor unit arranged as a semiconductor chip;
   wherein at least two photodetectors are arranged on a front side of the sensor unit facing the graduation, electrical connections of the sensor unit routed to contact surfaces on a rear side of the sensor unit by metallic vias, the sensor unit directly connected to the printed circuit board via the contact surfaces of the sensor unit being directly solder-connected to corresponding contact surfaces on the printed circuit board; and
   wherein a scanning distance between the front side of the sensor unit and a surface of the graduation is less than 0.55 mm.

14. The position measuring device according to claim 13, wherein the position measuring device includes no scanning plate between the measuring standard and the scanning unit.

15. A position measuring device, comprising:
   a measuring standard; and
   a scanning unit;
   wherein the measuring standard and the scanning unit are movable relative to each other in a measurement direction;
   wherein the measuring standard includes a graduation that is scannable by the scanning unit to generate positional signals, the scanning unit including an illumination unit and a detector unit adapted to generate the positional signals, the illumination unit adapted to emit light in a direction of the graduation, the detector unit adapted to detect light modulated by the graduation, the detector unit including a printed circuit board and a sensor unit, the sensor unit arranged as a semiconductor chip;
   wherein at least two photodetectors are arranged on a front side of the sensor unit facing the graduation, electrical connections of the sensor unit routed to contact surfaces on a rear side of the sensor unit by metallic vias, the sensor unit directly connected to the printed circuit board via the contact surfaces of the sensor unit being directly solder-connected to corresponding contact surfaces on the printed circuit board; and
   wherein the position measuring device includes no scanning plate between the measuring standard and the scanning unit.

* * * * *